(12) United States Patent
Song et al.

(10) Patent No.: US 11,081,501 B2
(45) Date of Patent: Aug. 3, 2021

(54) THIN FILM TRANSISTOR AND METHOD OF FABRICATING THE SAME, ARRAY SUBSTRATE AND METHOD OF FABRICATING THE SAME, DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Wei Song, Beijing (CN); Ce Zhao, Beijing (CN); Bin Zhou, Beijing (CN); Dongfang Wang, Beijing (CN); Yuankui Ding, Beijing (CN); Jun Liu, Beijing (CN); Yingbin Hu, Beijing (CN); Wei Li, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

(*) Notice: Subject to any disclaimer, the term of this patent is extended or adjusted under 35 U.S.C. 154(b) by 97 days.

(21) Appl. No.: 16/395,660

(22) Filed: Apr. 26, 2019

(65) Prior Publication Data
US 2020/0091199 A1    Mar. 19, 2020

(30) Foreign Application Priority Data

Sep. 17, 2018 (CN) .......................... 201811081440.9

(51) Int. Cl.
*H01L 29/786* (2006.01)
*H01L 27/12* (2006.01)
(Continued)

(52) U.S. Cl.
CPC .... *H01L 27/1225* (2013.01); *H01L 21/02244* (2013.01); *H01L 21/02258* (2013.01);
(Continued)

(58) Field of Classification Search
CPC .......... H01L 29/66969; H01L 29/7869; H01L 29/78693; H01L 29/401; H01L 29/41733;
(Continued)

(56) References Cited

U.S. PATENT DOCUMENTS

| 10,559,698 B2 | 2/2020 | Liu et al. |
| 2014/0061633 A1* | 3/2014 | Wang ................ H01L 29/78606 257/43 |

(Continued)

FOREIGN PATENT DOCUMENTS

| CN | 104617152 A | 5/2015 |
| CN | 106847932 A | 6/2017 |

(Continued)

OTHER PUBLICATIONS

First Office Action, including Search Report, for Chinese Patent Application No. 201811081440.9, dated Mar. 2, 2020, 17 pages.

*Primary Examiner* — Yu Chen
(74) *Attorney, Agent, or Firm* — Westman, Champlin & Koehler, P.A.

(57) ABSTRACT

A thin film transistor and a method of fabricating the same, an array substrate and a method of fabricating the same, and a display device are provided, the method of fabricating a thin film transistor includes: forming an active layer on a base substrate; forming a metal layer on the active layer; and processing the metal layer to form a source electrode, a drain electrode, and a metal oxide layer, the metal oxide layer covering the source electrode, the drain electrode, and the
(Continued)

active layer, the source electrode and the drain electrode being spaced apart and insulated from each other by the metal oxide layer.

16 Claims, 4 Drawing Sheets

(51) Int. Cl.
<table>
<tr><td>H01L 21/3213</td><td>(2006.01)</td></tr>
<tr><td>H01L 29/40</td><td>(2006.01)</td></tr>
<tr><td>H01L 29/66</td><td>(2006.01)</td></tr>
<tr><td>H01L 21/02</td><td>(2006.01)</td></tr>
<tr><td>H01L 21/473</td><td>(2006.01)</td></tr>
<tr><td>H01L 21/44</td><td>(2006.01)</td></tr>
<tr><td>H01L 29/417</td><td>(2006.01)</td></tr>
</table>

(52) U.S. Cl.
CPC ........ *H01L 21/32134* (2013.01); *H01L 21/44* (2013.01); *H01L 21/473* (2013.01); *H01L 27/1248* (2013.01); *H01L 29/401* (2013.01); *H01L 29/66969* (2013.01); *H01L 29/78693* (2013.01); *H01L 21/02255* (2013.01); *H01L 29/41733* (2013.01)

(58) Field of Classification Search
CPC . H01L 21/473; H01L 21/44; H01L 21/32134; H01L 21/02255; H01L 21/02258; H01L 21/02244
See application file for complete search history.

(56) References Cited

U.S. PATENT DOCUMENTS

<table>
<tr><td>2014/0061634 A1*</td><td>3/2014</td><td>Cao</td><td>H01L 29/66969<br>257/43</td></tr>
<tr><td>2015/0115258 A1*</td><td>4/2015</td><td>Beak</td><td>H01L 21/02244<br>257/43</td></tr>
<tr><td>2016/0343863 A1</td><td>11/2016</td><td>Chi</td><td></td></tr>
<tr><td>2017/0316953 A1*</td><td>11/2017</td><td>Zhang</td><td>H01L 29/7869</td></tr>
<tr><td>2019/0097058 A1</td><td>3/2019</td><td>Liu et al.</td><td></td></tr>
</table>

FOREIGN PATENT DOCUMENTS

<table>
<tr><td>CN</td><td>106920754 A</td><td>*</td><td>7/2017</td><td>....... H01L 29/78633</td></tr>
<tr><td>CN</td><td>107331725 A</td><td></td><td>11/2017</td><td></td></tr>
<tr><td>CN</td><td>107658345 A</td><td></td><td>2/2018</td><td></td></tr>
<tr><td>CN</td><td>108198824 A</td><td></td><td>6/2018</td><td></td></tr>
</table>

* cited by examiner ium oxide layer substantially covering the source electrode, the drain electrode, and the active layer, wherein a material of the metal oxide layer comprises an oxide of a metal material of which the source electrode and the drain electrode are made, and the source electrode and the drain electrode are spaced apart and insulated from each other by the metal oxide layer.

THIN FILM TRANSISTOR AND METHOD OF FABRICATING THE SAME, ARRAY SUBSTRATE AND METHOD OF FABRICATING THE SAME, DISPLAY DEVICE

CROSS-REFERENCE TO RELATED APPLICATION

This application claims the benefit of Chinese Patent Application No. 201811081440.9 filed on Sep. 17, 2018 in the State Intellectual Property Office of China, the whole disclosure of which is incorporated herein by reference.

TECHNICAL FIELD

The present disclosure relates to the field of display technology, and in particular, to a thin film transistor and a method of fabricating the same, an array substrate and a method of fabricating the same, and a display device.

BACKGROUND

With the continuous development and application of display products, the design and process requirements for array substrates and thin film transistors therein are gradually increasing.

SUMMARY

Some embodiments of the present disclosure provide a method of fabricating a thin film transistor, the method comprising: forming an active layer on a base substrate; forming a metal layer on the active layer; and processing the metal layer to form a source electrode, a drain electrode, and a metal oxide layer, the metal oxide layer covering the source electrode, the drain electrode, and the active layer, the source electrode and the drain electrode being spaced apart and insulated from each other by the metal oxide layer.

In some embodiments, the processing the metal layer to form the source electrode, the drain electrode, and the metal oxide layer comprises: etching a first portion of the metal layer in a first predetermined region on the active layer by an etching depth, the etching depth being less than a thickness of the metal layer; and performing an oxidation treatment on the metal layer etched to form the source electrode, the drain electrode, and the metal oxide layer, a remaining portion of the metal layer etched in the first predetermined region being completely oxidized.

In some embodiments, an orthographic projection of the first predetermined region on the base substrate falls within an orthographic projection of the active layer on the base substrate.

In some embodiments, the oxidation treatment is performed by an oxidation depth, the oxidation depth is smaller than the thickness of the metal layer.

In some embodiments, the etching depth is controlled by an etching duration and/or an etching solution concentration.

In some embodiments, the oxidation treatment comprises anodic oxidation and/or thermal oxidation.

In some embodiments, the oxidation depth is controlled by adjusting an oxidation parameter.

In some embodiments, the forming the metal layer on the active layer comprises: forming the metal layer on the base substrate on which the active layer is formed such that an orthographic projection of the active layer on the base substrate falls within an orthographic projection of the metal layer on the base substrate.

In some embodiments, the method further comprising: etching a second portion of the metal layer in a second predetermined region and a third portion of the metal layer in a third predetermined region by the etching depth while etching the first portion of the metal layer in the first predetermined region on the active layer, the second predetermined region and the third predetermined region being respectively on opposite sides of the active layer.

In some embodiments, the source electrode is formed between the first predetermined region and the second predetermined region, and the drain electrode is formed between the first predetermined region and the third predetermined region.

In some embodiments, a material of the metal layer comprises aluminum or an aluminum-neodymium alloy.

In some embodiments, the active layer comprises an oxide.

In some embodiments, the oxide comprises amorphous IGZO.

In some embodiments, before forming an active layer on the base substrate, the method further comprises: forming a gate electrode on the base substrate; and forming a gate insulating layer on the base substrate on which the gate electrode is formed, the gate insulating layer covering the gate electrode, wherein the active layer is formed on a side of the gate insulating layer facing away from the base substrate.

Some embodiment of the present disclosure provide a thin film transistor comprising: an active layer on a base substrate; a source electrode and a drain electrode spaced apart from each other, each of the source electrode and drain electrode covering at least a portion of the active layer; and a metal oxide layer substantially covering the source electrode, the drain electrode, and the active layer, wherein a material of the metal oxide layer comprises an oxide of a metal material of which the source electrode and the drain electrode are made, and the source electrode and the drain electrode are spaced apart and insulated from each other by the metal oxide layer.

In some embodiments, the source electrode covers a first end of the active layer, and the drain electrode covers a second end of the active layer.

In some embodiments, the thin film transistor further comprising: a gate electrode between the active layer and the base substrate; and a gate insulating layer between the gate electrode and the active layer, wherein the gate insulating layer covers the gate electrode.

Some embodiments of the present disclosure provide an array substrate comprising at least one thin film transistor according to the above embodiments.

Some embodiments of the present disclosure provide a display device comprising the array substrate according to the above embodiments.

BRIEF DESCRIPTION OF THE DRAWINGS

In order to more clearly illustrate technical solutions of embodiments of the present disclosure, the drawings to be used in the description of the embodiments of the present disclosure will be briefly described below. It is obvious that the drawings in the following description are only some embodiments of the present disclosure. For those skilled in the art, other drawings can be obtained according to these drawings without paying creative work.

DETAILED DESCRIPTION OF THE EMBODIMENTS

In order to make the objects, features and advantages of the present disclosure more obvious and understandable, the present disclosure will be further described in detail below in conjunction with the drawings and specific embodiments.

Figure 1:
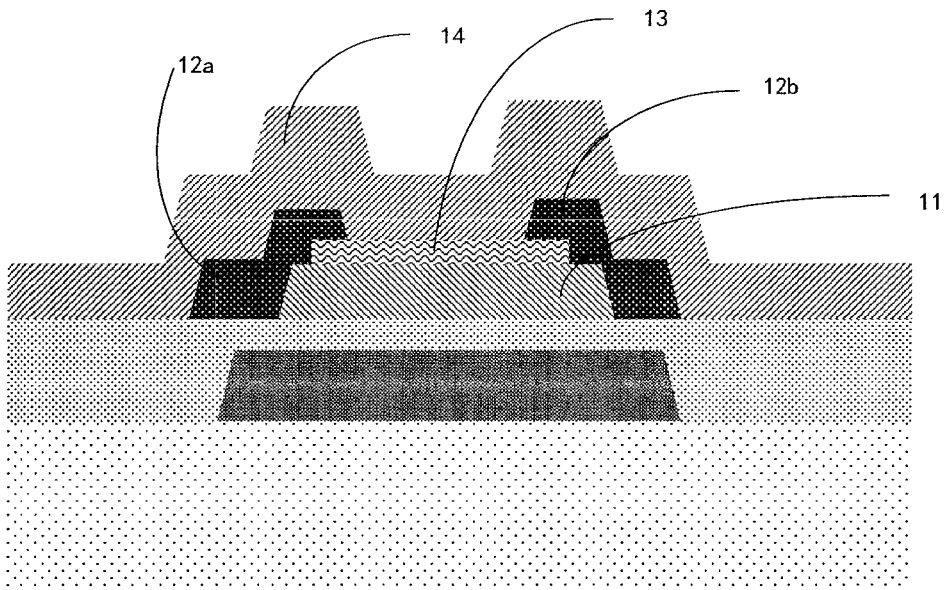
FIG. 1 is a cross-sectional structural view of an oxide thin film transistor in the related art.

In the related art, an oxide thin film transistor has higher electron mobility than an amorphous silicon thin film transistor and/or a polysilicon thin film transistor, and is more suitable for use in a large-sized display panel. Referring to FIG. 1, FIG. 1 shows a cross-sectional structural view of an oxide thin film transistor in the related art. Since a material of an active layer 11 of a thin film transistor TFT includes an oxide such as amorphous IGZO (In—Ga—Zn—O), the active layer 11 is prone to be damaged by an acidic or alkaline etching solution. It is required to form an etch barrier layer 13 on the active layer 11 before forming a source electrode 12a and a drain electrode 12b, thereby preventing the etching solution in the subsequent etching process from damaging the active layer 11. In addition, in order to ensure the stability of the TFT device and prevent external water and/or oxygen from damaging the active layer 11, a passivation layer 14 is deposited after the source electrode 12a and the drain electrode 12b are formed. Applicants have found that since the etch barrier layer 13 and the passivation layer 14 are formed by plasma enhanced chemical vapor deposition (PECVD) devices, respectively, the process is relatively complicated and the operation cost of the devices is high.

Figure 2:
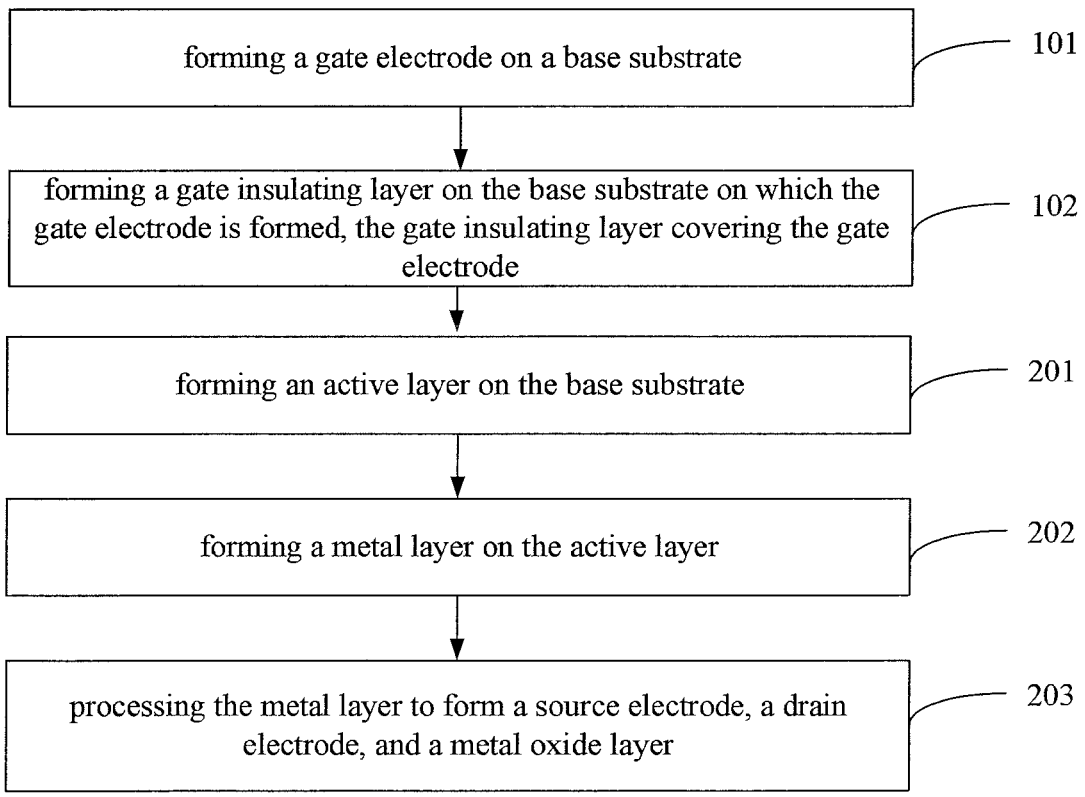
FIG. 2 shows a flow chart of a method of fabricating a thin film transistor according to some embodiments of the present disclosure.

In order to solve the above problems, some embodiments of the present disclosure provide a method of fabricating a thin film transistor, and FIG. 2 shows a flow chart of a method of fabricating a thin film transistor according to some embodiments of the present disclosure. Referring to FIG. 2, the method may include:

Step 201: Forming an Active Layer on a Base Substrate;

Step 202: forming a metal layer on the active layer;

Step 203: processing the metal layer to form a source electrode, a drain electrode, and a metal oxide layer, the metal oxide layer covering the source electrode, the drain electrode, and the active layer, the source electrode and the drain electrode being spaced apart and insulated from each other by the metal oxide layer.

Figure 3:
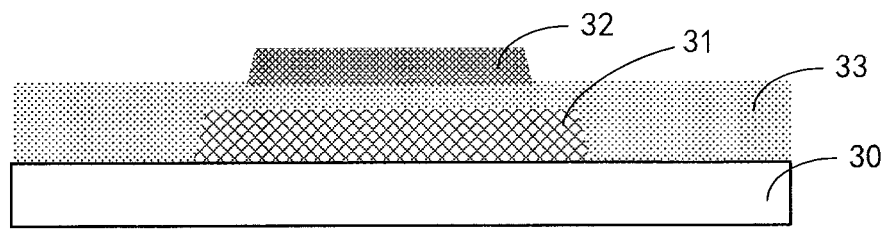
FIG. 3 is a schematic cross-sectional structural view showing a thin film transistor obtained after step 201 in the method of FIG. 2 is completed according to some embodiments of the present disclosure.

FIG. 3 is a schematic cross-sectional structural view showing the thin film transistor obtained after completion of step 201 in the preparation process. The base substrate 30 may be a glass substrate or a flexible substrate or the like. In step 201, the active layer 32 may be formed on the base substrate 30 by a series of patterning processes such as exposure, development, etching, and the like.

Figure 4:
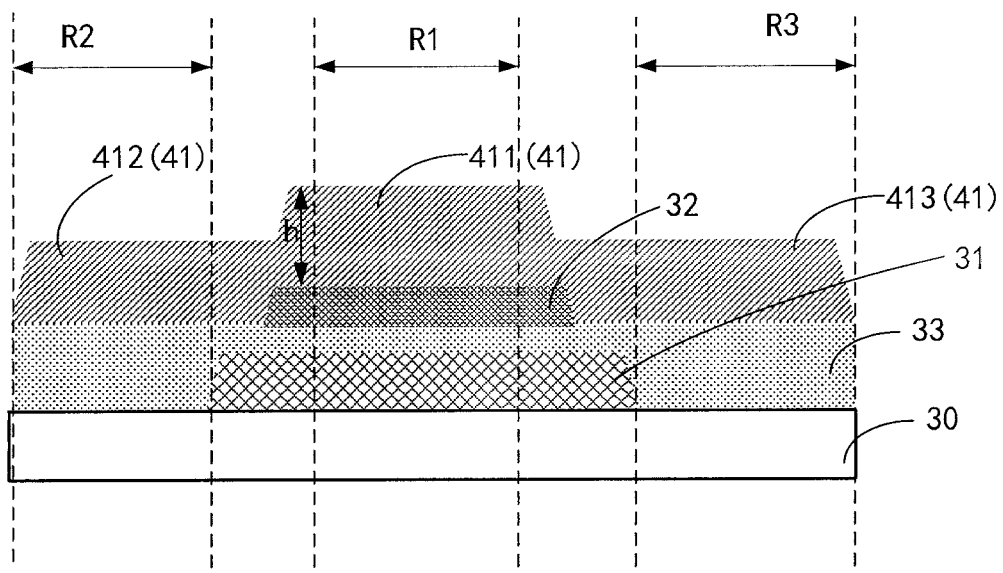
FIG. 4 is a schematic cross-sectional structural view showing a thin film transistor obtained after step 202 in the method of FIG. 2 is completed according to some embodiments of the present disclosure.

FIG. 4 is a schematic cross-sectional structural view showing the thin film transistor obtained after completion of step 202 in the preparation process. In step 202, the metal layer 41 may be formed on the active layer 32, for example, by sputtering, deposition, or the like, and the metal layer 41 is formed to have a thickness h. A material of the metal layer 41 may be, for example, aluminum (Al) or an aluminum-neodymium (Al—Nd) alloy or the like, and may be used as a material of the source electrode and the drain electrode. As shown in FIG. 4, the metal layer 41 covers the active layer 32, and an orthographic projection of the active layer 32 on the base substrate 30 falls within an orthographic projection of the metal layer 41 on the base substrate 30. In some embodiments, the metal layer 41 may cover partial regions of the base substrate 30 on both sides of the active layer 32.

Figure 5:
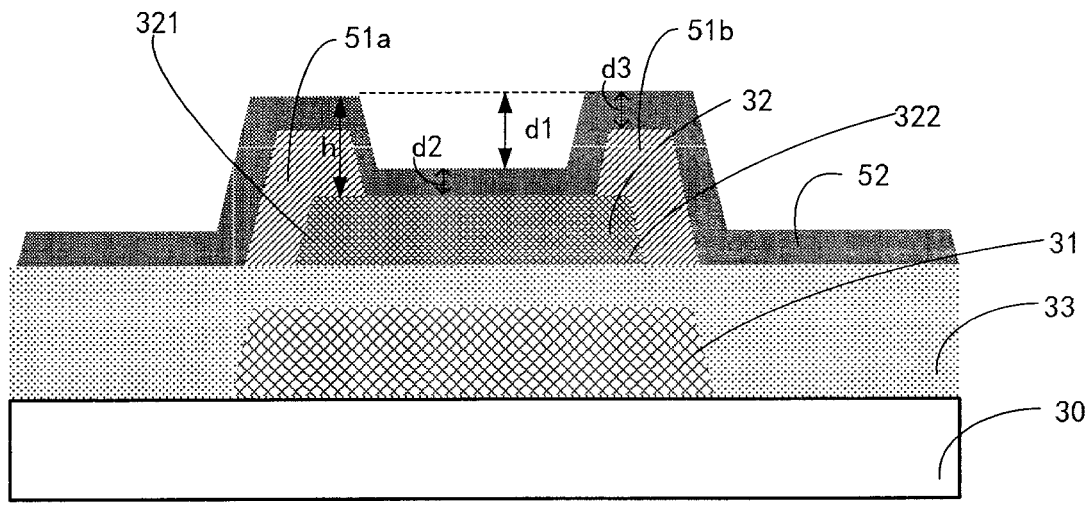
FIG. 5 is a schematic cross-sectional structural view showing a thin film transistor obtained after step 203 in the method of FIG. 2 is completed according to some embodiments of the present disclosure.

FIG. 5 is a schematic cross-sectional structural view showing the thin film transistor obtained after completion of step 203 in the preparation process. As shown in FIG. 5, the source electrode 51a and the drain electrode 51b are spaced apart from each other and cover a first end 321 and a second end 322 of the active layer 32, respectively, and the first end 321 and the second end 322 of the active layer 32 are opposite to each other. The metal oxide layer 52 covers the source electrode 51a, the drain electrode 51b, and the active layer 32, and the source electrode 51a and the drain electrode 51b are spaced apart from each other and insulated from each other by the metal oxide layer 52. In step 203, there are various manners of processing the metal layer 41 to form the source electrode 51a, the drain electrode 51b, and the metal oxide layer 52. For example, the metal layer 41 may be sequentially etched and oxidized to form the source electrode 51a, the drain electrode 51b and the metal oxide layer 52. The specific fabricating process of the source electrode 51a, the drain electrode 51b, and the metal oxide layer 52 will be described in detail in subsequent embodiments.

In some embodiments, the source electrode 51a, the drain electrode 51b, and the metal oxide layer 52 may be formed simultaneously during the process of processing the metal layer 41. In this case, the material of the metal oxide layer 52 may be an oxide of a metal material which the source electrode 51a the drain electrode 51b are made of. For example, when the metal material of the source electrode 51a and the drain electrode 51b is Al, the material of the metal oxide layer 52 may be $Al_2O_3$; and a thickness of the metal oxide layer 52 is generally less than that of the metal layer 41.

In the method of fabricating the thin film transistor provided by the embodiments, the metal layer is processed to simultaneously form the source electrode, the drain electrode, and the metal oxide layer so that the metal oxide layer prevents the active layer from being damaged by the etching solution in a subsequent etching process and prevents external water and/or oxygen from damaging the active layer. Therefore, the preparation of the metal oxide layer can replace the preparations of the etch barrier layer and the passivation layer in the related art, that is, there is no need to form the etch barrier layer and the passivation layer by the PECVD devices in different steps, thereby simplifying the fabricating process and reducing the cost.

In the embodiments, the active layer 32 may be an oxide active layer, and may be other types of active layers, such as a polysilicon active layer, an amorphous silicon active layer, or the like.

In the embodiments, the metal oxide layer 52 is insulated such that the source electrode 51a and the drain electrode 51b are spaced apart from each other and insulated from each other.

Figure 6:
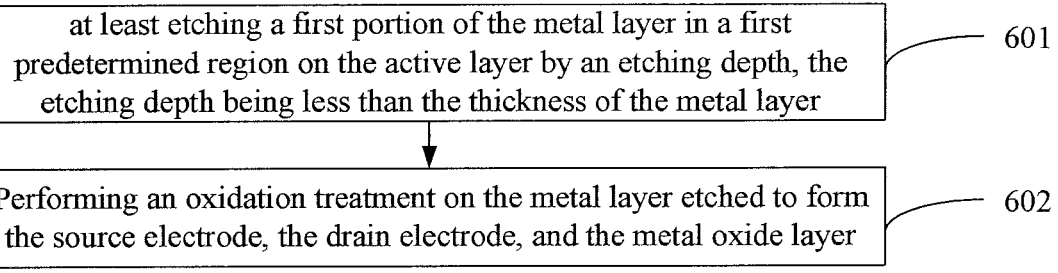
FIG. 6 shows a specific flowchart of step 203 in the method of FIG. 2 according to some embodiments of the present disclosure.

FIG. 6 is a specific flowchart of step 203 in FIG. 2 according to some embodiments of the present disclosure. In some embodiments, as shown in FIG. 6, the foregoing step 203 may include:

Step 601: at least etching a first portion of the metal layer in a first predetermined region on the active layer by an etching depth, the etching depth being less than the thickness of the metal layer;

Step 602: performing an oxidation treatment on the metal layer etched to form the source electrode, the drain electrode, and the metal oxide layer, and a remaining portion of the metal layer etched in the first predetermined region is completely oxidized.

Figure 7:
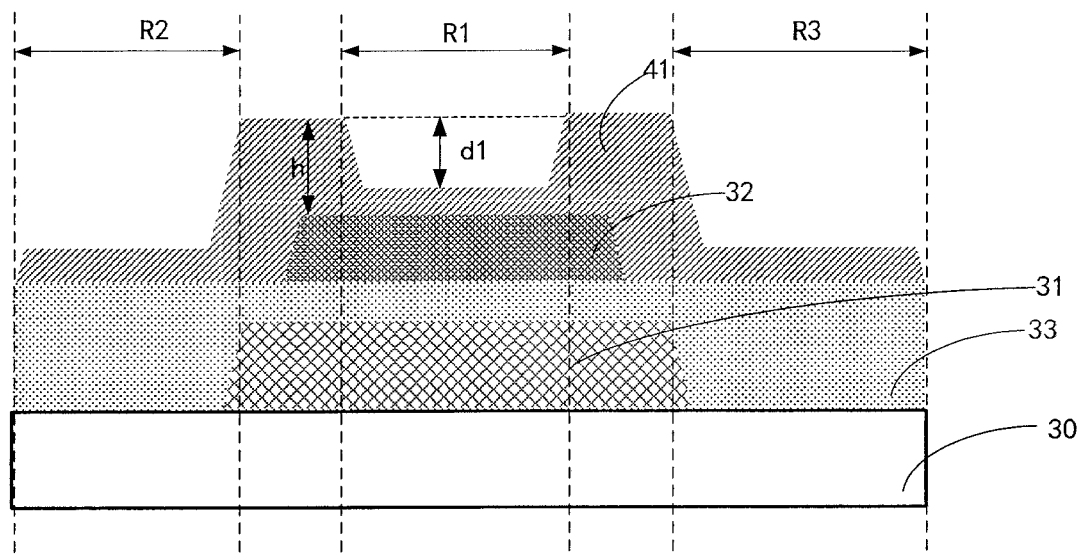
FIG. 7 is a schematic cross-sectional structural view showing a thin film transistor obtained after step 601 of FIG. 6 is completed according to some embodiments of the present disclosure.

FIG. 7 is a schematic cross-sectional structural view showing a thin film transistor obtained after completion of step 601 in the preparation process. As shown in FIG. 4 and FIG. 7, in step 601, at least the first portion 411 of the metal layer 41 in the first predetermined region R1 on the active layer 32 is etched by the etching depth d1 which is less than the thickness h of the metal layer 41. In some embodiments, in step 601, the second portion 412 of the metal layer 41 in the second predetermined region R2 and the third portion 413 of the metal layer 41 in the third predetermined region R3 are etched by the same etching depth d1 while the first portion 411 of the metal layer 41 in the first predetermined region R1 on the active layer 32 is etched, the second predetermined region R2 and the third predetermined region R3 are respectively located on both sides of the active layer 32. In some embodiments, etching of the second portion 412 of the metal layer 41 in the second predetermined region R2 and/or etching of the third portion 413 of the metal layer 41 in the third predetermined region R3 may be not performed at the same time as etching of the first portion 411 of the metal layer 41 in the first predetermined region R1 on the active layer 32. In this case, the etching depth(s) of the second portion 412 of the metal layer 41 in the second predetermined region R2 and/or the third portion 413 of the metal layer 41 in the third predetermined region R3 may be different from the etching depth h of the first portion 411 of the metal layer 41 in the first predetermined region R1 on the active layer 32, they/it may be less than or equal to the thickness of the metal layer 41.

In step 601, for example, first, the metal layer 41 may be coated with a photoresist, and the photoresist is exposed by a mask and developed to expose a portion of the metal layer 41 to be etched, and then the metal layer 41 is etched partially.

In some embodiments, different portions of the metal layer can be controlled to be etched in different etching steps by using a gray scale mask during exposure to obtain different etching depths, and the etching depth may be also controlled by an etching duration and/or an etching solution concentration during the etching process.

In order to avoid the influence of the etching solution on the active layer 32 during the etching process, the etching depth d1 of the first portion 411 of the metal layer 41 in the first predetermined region R1 on the active layer 32 must be less than the thickness h of the metal layer 41 formed in step 202. In this way, the remaining metal layer after etching in the first predetermined region R1 on the active layer 32 can be oxidized to form a protection layer on the active layer 32, the protection layer prevents the etching solution from directly contacting the active layer 32 and damaging the active layer 32, and functions as an etch barrier layer. Therefore, the method of fabricating the thin film transistor provided by the embodiments does not require additional deposition of an etch barrier layer, which simplifies the process and reduces the cost.

In some embodiments, the orthographic projection of the first predetermined region R1 on the base substrate 30 falls within the orthographic projection of the active layer 32 on the base substrate 30. As shown in FIGS. 4 and 7, the first predetermined region R1 is located between the first end 321 and the second end 322 of the active layer 32.

In some embodiments, as shown in FIGS. 4 and 7, the second predetermined region R2 and the third predetermined region R3 are respectively located on both sides of the active layer 32, and the second portion 412 of the metal layer 41 in the second predetermined region R2 and the third portion 413 of the metal layer 41 in the third predetermined region R3 is also partially etched. In this case, a portion of the metal layer between the first predetermined region R1 and the second predetermined region R2 and a portion of the metal layer between the first predetermined region R1 and the third predetermined region R3 are not etched to maintain the original thickness h, such that the source electrode and the drain electrode electrically connected to the active layer 32 are formed in a subsequent process.

In step 602, the metal layer etched is oxidized to form the metal oxide layer 52, and an oxidization depth d3 is less than the thickness h of the metal layer 41, so that in a non-predetermined region, portions of the metal layer at both edges of the active layer 32 are partially oxidized to a metal oxide, and the remaining portions of the metal layer which are not oxidized act as the source electrode 51a and the drain electrode 51b, respectively. As shown in FIG. 5 and FIG. 7, the portion of the metal layer 41 between the first predetermined region R1 and the second predetermined region R2 is partially oxidized to form the source electrode 51a, and the portion of the metal layer 41 between the first predetermined region R1 and the third predetermined region R3 is partially oxidized to form the drain electrode 51b. The source electrode 51a covers the first end 321 of the active layer 32, and the drain electrode 51b covers the second end 322 of the active layer.

A remaining portion of the metal layer after etching in the first predetermined region R1 on the active layer 32 needs to be completely oxidized to form the metal oxide so that the source electrode 51a and the drain electrode 51b are insulated from each other. Therefore, in the first predetermined region R1, the thickness d2 of the metal oxide layer is less than or equal to the oxidation depth d3. In some embodiments, as shown in FIG. 5, in step 602, remaining portions of the metal layer after etching in both the second predetermined region R2 and the third predetermined region R3 are also completely oxidized. The metal oxide layer 52 covers the source electrode 51a, the drain electrode 51b, and the active layer 32.

In some embodiments, the remaining portions of the metal layer after etching in both the second predetermined region R2 and the third predetermined region R3 may also be partially oxidized, which is not limited in the present disclosure.

In some embodiments, the oxidation treatment of the metal layer etched may include anodic oxidation and/or thermal oxidation, or the like. When the metal layer is processed by the anodic oxidation, the ratio of the anodizing solution may be as follow: ammonium tartrate: ethylene glycol: water=2:68:30, the electrolyte concentration is 0.12 mol/L, and the pH value is 6.43. The specific oxidation process may include a constant current process and a constant voltage process. In the constant current process, the initial oxidation current density j is set to 0.5 mA/cm$^2$, and the constant current process ends when the maximum oxidation voltage Vmax is equal to 100 V. The constant voltage process is started while the constant current process is finished, and the oxidation voltage Vc is set to 100V, the anodization time is controlled to be about 1.5 hours, and the current is about 6-9 μA. It should be noted that the specific parameters in the anodic oxidation process may be adjusted according to actual conditions, and the specific parameters are not limited in the present disclosure.

When the metal layer is processed by a thermal oxidation process, the metal layer etched may be directly heated under an oxygen atmosphere, and the heating temperature may be between 200° C. and 350° C. The specific heating time and heating temperature may be determined according to actual needs, which is not limited in the present disclosure.

In some embodiments of the present disclosure, as shown in FIG. 2, before step 201, the method of fabricating the thin film transistor further includes:

Step 101: forming a gate electrode on the base substrate;

Step 102: forming a gate insulating layer on the base substrate on which the gate electrode is formed, the gate insulating layer covering the gate electrode.

The active layer formed in step 201 is formed on a side of the gate insulating layer facing away from the base substrate.

In step 101, specifically, the gate electrode 31 may be formed on the base substrate 30 by a series of patterning processes such as exposure, development, etching, and the like.

In step 102, specifically, the gate insulating layer 33 covering the gate electrode may be formed by a deposition process.

Some embodiments of the present disclosure provide a method of fabricating an array substrate, the array substrate including at least one thin film transistor. The method of fabricating the array substrate includes: providing a base substrate; and fabricating at least one thin film transistor on the base substrate by the method of fabricating the thin film transistor described in the foregoing embodiments. The method of fabricating the array substrate further includes forming a pixel electrode on the base substrate.

A thin film transistor is also provided in some embodiments of the present disclosure. Referring to FIG. 5, the thin film transistor may include an active layer 32, a source electrode 51a and a drain electrode 51b, and a metal oxide layer 52 disposed on a base substrate 30. Each of the source electrode 51a and the drain electrode 51b covers at least a portion of the active layer 32, for example, the source electrode 51a and the drain electrode 51b cover the first end 321 and the second end 322 of the active layer 32, respectively. The metal oxide layer 52 substantially covers the source electrode 51a, the drain electrode 51b and the active layer 32. The material of the metal oxide layer 52 may be an oxide of a metal material which the source electrode 51a the drain electrode 51b are made of. The source electrode 51a and the drain electrode 51b are spaced apart from each other and insulated from each other by the metal oxide layer 52.

Specifically, when the material of the source electrode 51a and the drain electrode 51b is aluminum (Al) or aluminum-neodymium (Al—Nd) alloy, the material of the metal oxide layer 52 is an oxide of aluminum (Al) or an aluminum-neodymium (Al—Nd) alloy. It should be noted that the materials of the source electrode 51a, the drain electrode 51b, and the metal oxide layer 52 are not limited to these two types, and any conductive metal material that can serve as the source electrode 51a and the drain electrode 51b falls within the protection range of the present embodiments.

The thin film transistor in the embodiments may be a thin film transistor prepared by the method provided in any of the above embodiments.

In order to insulate the source electrode 51a and the drain electrode 51b from each other, it is required that the metal oxide layer 52 provided on the active layer 32 is insulated.

In some embodiments, referring to FIG. 5, the thin film transistor may further include a gate electrode 31 and a gate insulating layer 33 which are sequentially disposed on the base substrate. The gate insulating layer 33 covers the gate electrode 31; and the active layer 32 is disposed on a side of the gate insulating layer 33 faces away from the base substrate 30. The base substrate 30 may be a glass substrate or a flexible substrate.

An array substrate is also provided in some embodiments of the present disclosure, and the array substrate may include at least one thin film transistor according to any of the above embodiments.

Some embodiments of the present disclosure further provide a display device which may include the above array substrate.

It should be noted that the display device in the embodiments may be any product or component having a display function such as a display panel, an electronic paper, a mobile phone, a tablet computer, a television, a notebook computer, a digital photo frame, a navigator, and the like.

Embodiments of the present disclosure provide a thin film transistor and a method of fabricating the same, an array substrate and a method of fabricating the same, and a display device. The method of fabricating a thin film transistor simultaneously forms a source electrode, a drain electrode, and a metal oxide layer by processing a metal layer. The metal oxide layer can prevent the active layer from being damaged by the etching solution in the subsequent etching process, and can also prevent the external water and oxygen from damaging the active layer. Therefore, the preparation of the metal oxide layer can replace the preparations of the etch barrier layer and the passivation layer in the related art, that is, there is no need to form the etch barrier layer and the passivation layer by the PECVD devices in different steps, thereby simplifying the fabricating process and reducing the cost.

The various embodiments in the present disclosure are described in an exemplary manner, and each of the embodiments focuses on differences from other embodiments, and the same or similar parts between the respective embodiments may be referred to each other.

Finally, it should also be noted that in the present disclosure, relational terms such as "first" and "second" are used merely to distinguish one entity or operation from another entity or operation, and they do not necessarily require or imply any such actual relationship or order between these entities or operations. Furthermore, the terms "comprise(s)" or "comprising" or any other variations are intended to encompass a non-exclusive inclusion, such that a process, a method, a commodity, or a device that include a set of elements include not only these elements, but also other elements not explicitly listed, or elements inherent to such process, method, commodity, or device. An element defined by the phrase "comprising a(n) . . . " without further limitation does not exclude the existence of additional identical elements in the process, method, commodity, or device that includes the element.

A thin film transistor and a method of fabricating the same, an array substrate and a method of fabricating the same, and a display device provided by the present disclosure are described in detail above. The principles and embodiments of the present disclosure have been described herein with reference to specific examples, and the description of the above embodiments is only to assist in understanding the method of the present disclosure and its core idea. In the meantime, those skilled in the art will be able to change the embodiments and the scope of the present disclosure according to the idea of the present disclosure. In summary, the content of the present disclosure should not be construed as limiting the disclosure.

What is claimed is:

1. A method of fabricating a thin film transistor, the method comprising:
    forming an active layer on a base substrate;
    forming a metal layer on the active layer; and
    processing the metal layer to form a source electrode, a drain electrode, and a metal oxide layer, wherein the metal oxide layer at least covers a part of the active layer between the source electrode and the drain electrode, the metal oxide layer extends over and at least covers a surface of each of the source electrode and the drain electrode away from the base substrate, and the source electrode and the drain electrode are spaced apart and insulated from each other by the metal oxide layer.

2. The method according to claim 1, wherein the processing the metal layer to form the source electrode, the drain electrode, and the metal oxide layer comprises:
    etching a first portion of the metal layer in a first predetermined region on the active layer by an etching depth, the etching depth being less than a thickness of the metal layer; and
    performing an oxidation treatment on the metal layer etched to form the source electrode, the drain electrode, and the metal oxide layer, a remaining portion of the metal layer etched in the first predetermined region being completely oxidized.

3. The method according to claim 2, wherein an orthographic projection of the first predetermined region on the base substrate falls within an orthographic projection of the active layer on the base substrate.

4. The method according to claim 2, wherein the oxidation treatment is performed by an oxidation depth, the oxidation depth is smaller than the thickness of the metal layer.

5. The method according to claim 4, wherein the oxidation depth is controlled by adjusting an oxidation parameter.

6. The method according to claim 2, wherein the etching depth is controlled by an etching duration and/or an etching solution concentration.

7. The method according to claim 2, wherein the oxidation treatment comprises anodic oxidation and/or thermal oxidation.

8. The method according to claim 2, wherein the forming the metal layer on the active layer comprises:
    forming the metal layer on the base substrate on which the active layer is formed such that an orthographic projection of the active layer on the base substrate falls within an orthographic projection of the metal layer on the base substrate.

9. The method according to claim 8, further comprising:
    etching a second portion of the metal layer in a second predetermined region and a third portion of the metal layer in a third predetermined region by the etching depth while etching the first portion of the metal layer in the first predetermined region on the active layer, the second predetermined region and the third predetermined region being respectively on opposite sides of the active layer.

10. The method according to claim 9, wherein the source electrode is formed between the first predetermined region and the second predetermined region, and the drain electrode is formed between the first predetermined region and the third predetermined region.

11. The method according to claim 1, wherein a material of the metal layer comprises aluminum or an aluminum-neodymium alloy.

12. The method according to claim 1, wherein the active layer comprises an oxide.

13. The method according to claim 12, wherein the oxide comprises amorphous IGZO.

14. The method according to claim 1, wherein before forming an active layer on the base substrate, the method further comprises:
    forming a gate electrode on the base substrate; and
    forming a gate insulating layer on the base substrate on which the gate electrode is formed, the gate insulating layer covering the gate electrode, wherein the active layer is formed on a side of the gate insulating layer facing away from the base substrate.

15. The method according to claim 1, wherein the source electrode covers a first end of the active layer, the drain electrode covers a second end of the active layer, the metal oxide layer further extends over and at least covers a side surface of the source electrode away from the drain electrode, and the metal oxide layer further extends over and at least covers a side surface of the drain electrode away from the source electrode.

16. The method according to claim 1, wherein a material of the metal oxide layer is made of an oxide of a metal material of which the source electrode and the drain electrode are made.

* * * * *